United States Patent [19]

Endoh et al.

[11] Patent Number: 5,285,309
[45] Date of Patent: Feb. 8, 1994

[54] LASER LIGHT WAVELENGTH SHIFTER

[75] Inventors: Tetsuro Endoh; Kiichiro Shinokura, both of Tendo, Japan

[73] Assignee: Pioneer Electronic Corporation, Tokyo, Japan

[21] Appl. No.: 676,591

[22] Filed: Mar. 28, 1991

[30] Foreign Application Priority Data

Apr. 2, 1990 [JP] Japan .................................. 2-87781

[51] Int. Cl.$^5$ ............................................. H03F 7/00
[52] U.S. Cl. ........................................ 359/328; 372/18; 372/21; 372/22
[58] Field of Search .................... 372/6, 21, 22, 18; 359/326, 328

[56] References Cited

U.S. PATENT DOCUMENTS 4,910,738  3/1990  Fujita et al. .......................... 372/18
5,046,802  9/1991  Yamamoto et al. .................. 372/22
5,052,815  10/1991  Nightingale et al. ................ 372/19
5,058,981  10/1991  Umegaki et al. ..................... 359/641

OTHER PUBLICATIONS

"Principles of Lasers", Orazio Svelto, Plenum Press, New York, 1982, pp. 310-319. (No month).

*Primary Examiner*—James W. Davie
*Attorney, Agent, or Firm*—Sughrue, Mion, Zinn, Macpeak & Seas

[57] ABSTRACT

A laser light wavelength shifter is provided with a semiconductor laser. The semiconductor laser emits through mode-locked resonating action a mode-lock resonated light which serves as a fundamental wave and is in turn wavelength shifted. Accordingly, the wavelength shifting can be executed at high efficiency with the use of a simple arrangement.

2 Claims, 2 Drawing Sheets

LASER LIGHT WAVELENGTH SHIFTER

BACKGROUND OF THE INVENTION

1. Field of the Invention

The present invention relates to a laser light wavelength shifter and more particularly, a laser light wavelength shifter for shifting a laser light emitted from a semiconductor laser to a shorter wavelength laser light.

2. Description of the Related Art

Semiconductor lasers are commonly employed as the laser light source for use in various types of laser apparatuses which have to be compact in size for matching their applications. Also, it is desired that the laser light on each application apparatus has a shorter wavelength for attaining optimum performance.

For example, a recording capability allowing more data to be written into and read out from a given area of a recording medium has acquired a considerable value added in the case of an optical disk system, a laser printer, a laser scanner, and other optoelectronic apparatuses. For this purpose, it is necessary to converge a laser light into a spot of a smaller diameter. When the wavelength of a laser light is $\lambda$ and the angle of convergence is $\theta$, the diameter of a laser spot $\phi$ is obtained from:

$$\phi = 2\lambda/\pi\tan\phi$$

As understood, the smaller the laser wavelength $\lambda$, the smaller the spot diameter $\phi$ is focused. Thus, a shorter wavelength of laser light is needed for enhancement in the convergence of a laser light.

A laser source for producing a shorter wavelength of laser light is known as, e.g., an He-Cd laser, an excimer laser, or an Ar laser, each of which is too large in size to be successfully installed in any of the aforementioned laser apparatuses.

A semiconductor laser, which is a small-sized laser source, is eligible for installation in the laser application apparatuses described above. However, a technique of crystalline process required for producing such a semiconductor laser as satisfying the foregoing requirement has not yet been established. It will take some time before an improved laser producing a shorter wavelength of laser light is developed. So far, some laser light wavelength shifters have been proposed for shortening the wavelength of a laser light emitted from a known semiconductor laser to one half with the use of a second harmonics generator (abbreviated as SHG). An example of prior art laser light wavelength shifters will now be described.

A prior art shifter shown in FIG. 1 employs a single-mode semiconductor laser medium 31 as the light source for producing a single-mode fundamental wave which is essential for wavelength shift at high efficiency. In operation, a laser light emitted from the semiconductor laser 31 is converged by a condenser lens 32 onto the incident end of an SHG 33 formed of non-linear optical crystal using Cerenkov phase matching. Then, the SHG 33 decreases the wavelength of the laser light to a half.

Although the arrangement of the above-described shifter is simple, the single-mode semiconductor laser employed fails to produce a high power output of a single wavelength laser light which is as high as more than several hundreds of milliwatts. Accordingly, the efficiency of wavelength conversion stays low and no high power output of a wavelength shortened laser light (referred to as a frequency-doubled wave) will be obtained. Also, the frequency-doubled wave of Cerenkov phase matching propagates in a cone shape. Hence, a specific optical system is needed for convergence of the frequency-doubled wave.

Another prior art shifter shown in FIG. 2 has a multi-mode semiconductor laser 41 which serves as an exciting source and produces a high power of laser light. In operation, a laser light emitted from the multi-mode laser 41 is directed by a collimating lens 42 and dichroic mirror 43 to a solid laser medium 44 for excitation. Then, a solid laser resonator comprising the dichroic mirror 43, the solid laser medium 44, lenses 45 and 47, and a dichroic mirror 48 is activated for having a beam profile of appropriate convergence on an SHG crystal 46. As the result, a shifted light of which wavelength is a half of that of the input laser light is propagated from the SHG crystal 46 through the lens 47 and the dichroic mirror 48 for output.

As the wavelength shifting is carried out at two steps, the entire arrangement of this shifter becomes intricate. Also, a resultant frequency-doubled wave is more than 500 nm in the wavelength although its power is increased to a few milliwatts. The efficiency of shifting the output of a semiconductor laser is as low as about 1%. Hence, the laser has to be employed of high power supply, high power output type.

OBJECT AND SUMMARY OF THE INVENTION

It is an object of the present invention to provide a laser light wavelength shifter which is compact in size, simple in arrangement, and capable of providing a high power output of frequency-doubled waves (of wavelength shifted light) at high efficiency.

The laser light wavelength shifter of the present invention comprises a semiconductor laser medium, a resonator for producing mode-locked resonating action of the semiconductor laser medium, and a wavelength shifting device for shortening the wavelength of a mode-lock resonated light from the resonator.

In the operation of the laser light wavelength shifter according to the present invention, the semiconductor laser medium emits through mode-locked resonating action a mode-lock resonated laser light. The mode-lock resonated laser light serves as a fundamental wave and is in turn wavelength shifted.

DETAILED DESCRIPTION OF A PREFERRED EMBODIMENT

One preferred embodiment of the present invention will be described in detail with reference to the drawings.

Figure 1:
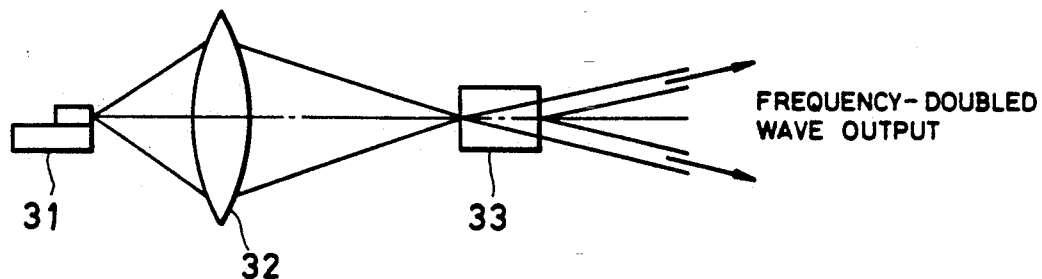
FIGS. 1 and 2 are schematic views of the optical system showing a couple of prior art laser light wavelength shifters.
Figure 2:
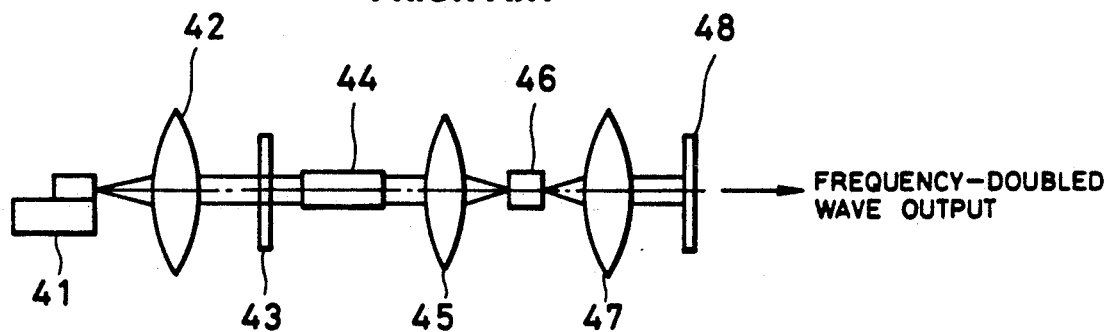
Figure 3:
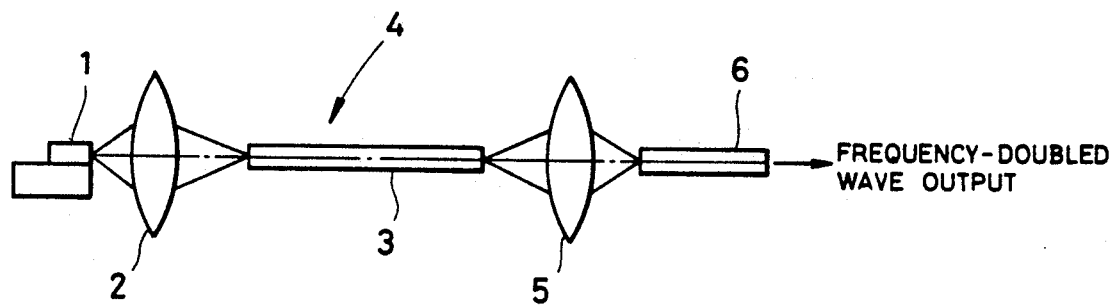
FIG. 3 is a schematic view of the optical system of a laser light wavelength shifter according to the present invention.

FIG. 3 is a schematic view of the optical system of a laser light wavelength shifter according to the present invention. As shown, denoted by the numeral 1 is a semiconductor laser medium device for emitting a laser light which serves as a fundamental wave, of which emitting side is coated with a non-reflective coating for transmission of the fundamental wave. A mode-locked resonator 4 thus consists of the semiconductor laser medium device 1, a coupling lens 2, and an optical fiber 3. Mode-lock resonance starts when an activating current having a frequency synchronized with a time required for one cycle movement of a laser light along the length of the resonator 4 is applied to the semiconductor laser medium device 1.

The fundamental wave mode-lock resonated is directed by a coupling lens 5 to an SHG 6 formed of non-linear optical crystal where it is shortened in the wavelength to a half prior to emission in the direction represented by the arrow in FIG. 3. The SHG 6 contains a crystal having such a non-linear optical constant that phase matching at 90° is effected on the waveform of a fundamental wave and thus, provides a propagation path extending in the matching direction. The emitting end of the SHG 6 is coated with a reflective coating for reflection of the fundamental wave. Accordingly, the remaining of the fundamental wave which has not been shortened in wavelength is reflected on the reflective coating while the frequency-doubled wave is transmitted. The SHG 6 may be of propagation path wavelength dispersion type, domain inversion type, or the like.

According to the foregoing arrangement, the output of fundamental wave is given 10 mW in average and more than 200 mW at highest peak in the form of a series of repeating pulses of over 500 Mpps. Although the foregoing arrangement constitutes an extra-cavity type SHG wavelength shifter, it may be an intra-cavity type SHG wavelength shifter containing a mode-locked laser resonator 4 consisted of such components 1, 2, 3, 5, and 6 as illustrated in FIG. 3. More than 500 Mpps of high repetition represents a frequency which is high enough to no more interfere the frequency (less than 20 MHz) of a common recording signal. As the shifting efficiency of the SHG 6 is proportional to an amplitude of the fundamental wave, the high peak output will contribute to the high efficiency of shifting. More particularly, the mode-locked resonance will be an useful technique for enhancement of the shifting efficiency in the SHG 6.

Also, the SHG 6 incorporates a 90° phase matched arrangement which exhibits one of the best properties of a crystalline material, thus providing further improvements in the shifting efficiency and stability. The highly efficient and stable resonance in the SHG 6 will then be explained in more detail.

The efficiency $\eta$ of shifting a fundamental wave to a frequency-doubled wave can be approximated using the following formula-attenuation of the fundamental wave during the shifting is not accounted.

$$\eta = Kl^2 \frac{\sin^2(\Delta kl/2)}{(\Delta kl/2)^2} \cdot \frac{P_w}{S}$$

where $\Delta k$ is $k^{2W} - 2k^W$ ($k^W$ and $k^{2W}$ are wave number vectors of the fundamental and frequency-doubled waves respectively), K is a constant (proportional to the square of a nonlinear constant), $P_W$ is the amplitude of the fundamental wave, S is the cross section area of a beam, and l is a coherent length.

The optimum phase matched arrangement for maximum efficiency is obtained when:

$$\sin^2(\Delta kl/2)/(\Delta kl/2)^2 = 1 (\Delta k \rightarrow 0)$$

Then, $$\eta = Kl^2 P_W/S$$

Now, the coherent length l is much regarded. When $\Delta k = 0$, that is, both the fundamental and frequency-doubled waves propagate along the phase plane in the same direction, their real propagating directions or pointing vector directions are deflected from each other (known as walk-off). Hence, the distance l which causes interference between the fundamental and frequency-doubled waves becomes short thus decreasing the shifting efficiency. It is thereby needed for having the two pointing vector directions to coincide in the phase matched state. If the matching angle $\theta m$ is 90°, the phase wave and the pointing vector are aligned in the same direction and thus, walk-off will be avoided. Accordingly, the distance l can be increased to a desired value. In other words, when the crystal is properly lengthened, the fundamental wave will be 100% shifted to the frequency-doubled wave without consideration of attenuation of the fundamental wave during the shifting.

In practice, the amplitude of the fundamental wave is attenuated during shifting and the efficiency of shifting the fundamental wave to the frequency-doubled wave is declined to a certain but acceptable rate. For achievement of the acceptable shifting rate, an optimum of the coherent length is needed. Hence, the 90° phase matched arrangement is essential for performing the shifting at high efficiency.

If phase mismatching occurs, $\Delta k$ is not zero. Then, the shifting efficiency $\eta$ is in proportion to, $$\sin^2(\Delta kl/2)/(\Delta kl/2)^2$$

(which is also designated as $\alpha$ for simplicity).

When the angle of the wave number vector of the frequency-doubled wave to Z-axis is $\theta$, the relation is expressed as:

$$\frac{\Delta kl}{2} = \frac{-Wl}{C_0} \sin(2\theta m) \frac{(n_e^{2W})^{-2} - (n_0^{2W})^{-2}}{2(n_0^W)^{-2}}$$

Then, even if there exists a phase mismatching $\theta - \theta m$, $\Delta kl/2 \rightarrow 0$ is established because $\sin(2\theta m) = 0$ when $\theta m$ is 90°. Hence, $\alpha$ can remain at the maximum value of 1. Accordingly, the 90° phase matched arrangement minimizes a change in the shifting efficiency which depends on angular variation such as deflection from the optical axis and the stable operation of the SHG will be ensured.

Figure 4:
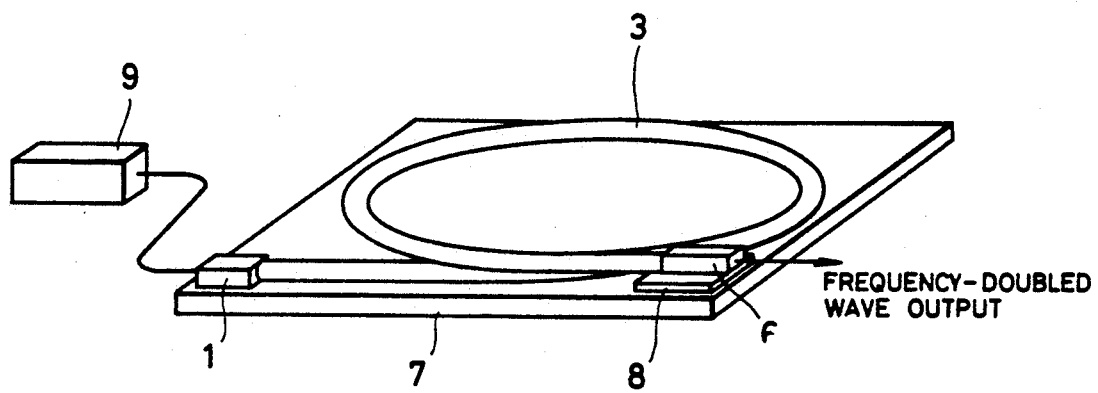
FIG. 4 is a schematic perspective view of the laser light wavelength shifter of the present invention.

The practical arrangement of the laser light wavelength shifter of the present invention will now be described referring to a schematic perspective view of FIG. 4.

A base 7 is formed of, e.g., alumina ceramic measuring a few centimeters square (for example, 3 cm×3 cm) and a few millimeters thick (for example, 2.5 mm). The base 7 also provides heat dissipation effects. The semiconductor laser 1 and the SHG 6 are aligned along one edge of the base 7 and coupled to each other by an optical fiber 3. The SHG 6 is mounted by a Peltier device 8 onto the base 7. Also, provided is a power source 9 for energizing the laser 1.

For mode-locked resonating action at, e.g., 500 Mpps in this arrangement, a resonator system having an optical length of 30 cm is needed. The optical fiber 3 is arranged for rendering the resonator system compact and thus, made of single-mode fiber which is short in the fiber length and 90° phase matched. The optical fiber 3 having 1.4 of refractive index extends 81.5 centimeters and may be coiled in a diameter of a few centimeters for installation onto the base 7 so that a compact, stable resonator can be constructed. If higher repetition of resonating actions is required, a shorter length of the optical fiber can be employed.

As described above, the laser light wavelength shifter according to the present invention is arranged in which a semiconductor laser is mode-lock resonated to a fundamental wave which is then wavelength shifted to a frequency-doubled wave. Accordingly, the wavelength shifting can be executed at high efficiency on a more compact, simple arrangement and also, a frequency-doubled wave of higher magnitude and higher repetition can be obtained, thus contributing to the improvement of various laser apparatuses. In addition, the laser light wavelength shifter can provide as short a width of pulse as several tens of picoseconds and thus, will successfully be used as a light source for time-base light resolving and splitting.

What is claimed is:

1. A laser light wavelength shifter comprising:
   a semiconductor laser medium for emitting a laser light which serves as a fundamental wave;
   a resonator means for producing a mode-locked resonating action of said semiconductor laser medium thereby to obtain a mode-lock resonated laser light; and
   a wavelength shifting device for shortening the wavelength of said mode-lock resonated laser light from said resonator means, said wavelength shifting device being positioned outside of said resonator means.
   wherein the wavelength shifting device is formed of non-linear optical crystal having a propagation path in the 90° phase matched direction.

2. A laser light wavelength shifter according to claim 1, wherein said resonator contains an optical fiber providing an optical path for said mode-locked resonating action.

* * * * *